United States Patent

Hotta et al.

[11] Patent Number: 5,846,477
[45] Date of Patent: Dec. 8, 1998

[54] PRODUCTION METHOD FOR ENCAPSULATING A SEMICONDUCTOR DEVICE

[75] Inventors: Yuji Hotta; Hitomi Shigyo; Shinichi Ohizumi, all of Osaka, Japan

[73] Assignee: Nitto Denko Corporation, Osaka, Japan

[21] Appl. No.: 568,690

[22] Filed: Dec. 7, 1995

[30] Foreign Application Priority Data

| Dec. 8, 1994 | [JP] | Japan | 6-304526 |
| Dec. 28, 1994 | [JP] | Japan | 6-327184 |
| Mar. 3, 1995 | [JP] | Japan | 7-043779 |
| Mar. 24, 1995 | [JP] | Japan | 7-066492 |

[51] Int. Cl.$^6$ .......................... B29C 33/18; B29C 33/68; B29C 45/02
[52] U.S. Cl. .............. 264/511; 264/272.14; 264/272.15; 264/272.17; 264/276; 425/116; 425/544
[58] Field of Search .......................... 264/272.11, 272.17, 264/272.15, 328.4, 328.5, 276, 264, 511, 328.9, 338; 425/116, 121, 117, 543, 544, 546

[56] References Cited

U.S. PATENT DOCUMENTS

| H1654 | 6/1997 | Rounds | 264/316 |
| 4,961,893 | 10/1990 | Rose | 264/247 |
| 5,000,903 | 3/1991 | Matzinger et al. | 264/266 |
| 5,151,276 | 9/1992 | Sato et al. | 264/272.17 |
| 5,350,553 | 9/1994 | Glaser et al. | 264/511 |
| 5,387,306 | 2/1995 | Jarvis | 264/272.17 |
| 5,417,905 | 5/1995 | Lemaire et al. | 264/263 |

FOREIGN PATENT DOCUMENTS 64-44026  2/1989  Japan .

OTHER PUBLICATIONS

"3P—'Pre–Packaged–Processing'—A revolution in IC packaging technology", BDM Nederland BV, May 1995.

Primary Examiner—Angela Ortiz
Attorney, Agent, or Firm—Sughrue, Mion, Zinn, Macpeak & Seas, PLLC

[57] ABSTRACT

A method of producing a semiconductor device by encapsulating a semiconductor element with a resin, which comprises disposing a semiconductor element with lead frames and an encapsulating resin in a state of being sandwiched between a pair of films on a molding mold having a port for setting the encapsulating resin, closing the mold, pressing the encapsulating resin between the films in a heated state by a plunger vertically moving in the pot, and injecting the molten encapsulating resin in the inside of the mold cavity from the pot portion through a runner portion to encapsulate the semiconductor element with the encapsulating resin.

10 Claims, 8 Drawing Sheets

PRODUCTION METHOD FOR ENCAPSULATING A SEMICONDUCTOR DEVICE

FIELD OF THE INVENTION

The present invention relates to a method of producing a semiconductor device by encapsulating a semiconductor element with a resin.

BACKGROUND OF THE INVENTION

Hitherto, for producing a semiconductor device by encapsulating a semiconductor element with a resin, a transfer molding method is employed by placing a powdery or tablet-form resin in a pot, heating the resin under pressure to melt it, and injecting the molten resin in the cavity portion of a mold followed by solidifying to produce the semiconductor device. According to this method, by injecting the molten resin in the mold at a low speed, a large amount of semiconductor devices each having a constant quality can be produced at a relatively low cost.

However, with the propagation of semiconductor devices, the requirement for lowering the cost has been more and more increased, and in the field of resin-encapsulation of semiconductor devices as described above it becomes necessary to greatly improve the productivity while keeping the good quality of the products, thereby meeting the above requirement.

In regard to this point, there are the problems in a conventional transfer molding method that in releasing a semiconductor device from a mold by pushing it with an eject pin after molding, there is a possibility of injuring the semiconductor device and also in the points of the productivity and the cost, a means for pushing out the eject pin must be equipped to the mold, which increases the mold cost, and also since wastes of the encapsulating material attach to the mold, the mold is required to be cleaned frequently.

SUMMARY OF THE INVENTION

The present invention has been made to overcome these problems.

An object of the present invention is to provide an encapsulation technique in a method of producing a semiconductor device by encapsulating a semiconductor element with a resin, which can either make cleaning work unnecessary or greatly reduce the repeating times of the cleaning work, which is necessary in conventional techniques, which greatly improves the mold-releasing property of a semiconductor device to a mold, and which can easily release a semiconductor device from a mold after molding without using an eject pin in order to eliminate the occurrence of damages of a semiconductor device and the increase of the mold cost due to the existence of the eject pin, and whereby a high productivity is obtained as compared with conventional techniques.

The object described above can be attained by the present invention as described hereinbelow.

According to the present invention, there is provided a method of producing a semiconductor device, which comprises disposing a semiconductor element with lead frames, and an encapsulating resin on a molding mold having a pot for setting the encapsulating resin in a state that the semiconductor element and the encapsulating resin are inserted between a pair of films, closing the mold, and then heating and pressing the encapsulating resin between the films to inject the molten resin into a mold cavity from the pot portion through a runner, whereby the semiconductor element is encapsulated with the resin.

DETAILED DESCRIPTION OF THE INVENTION

Figure 1:
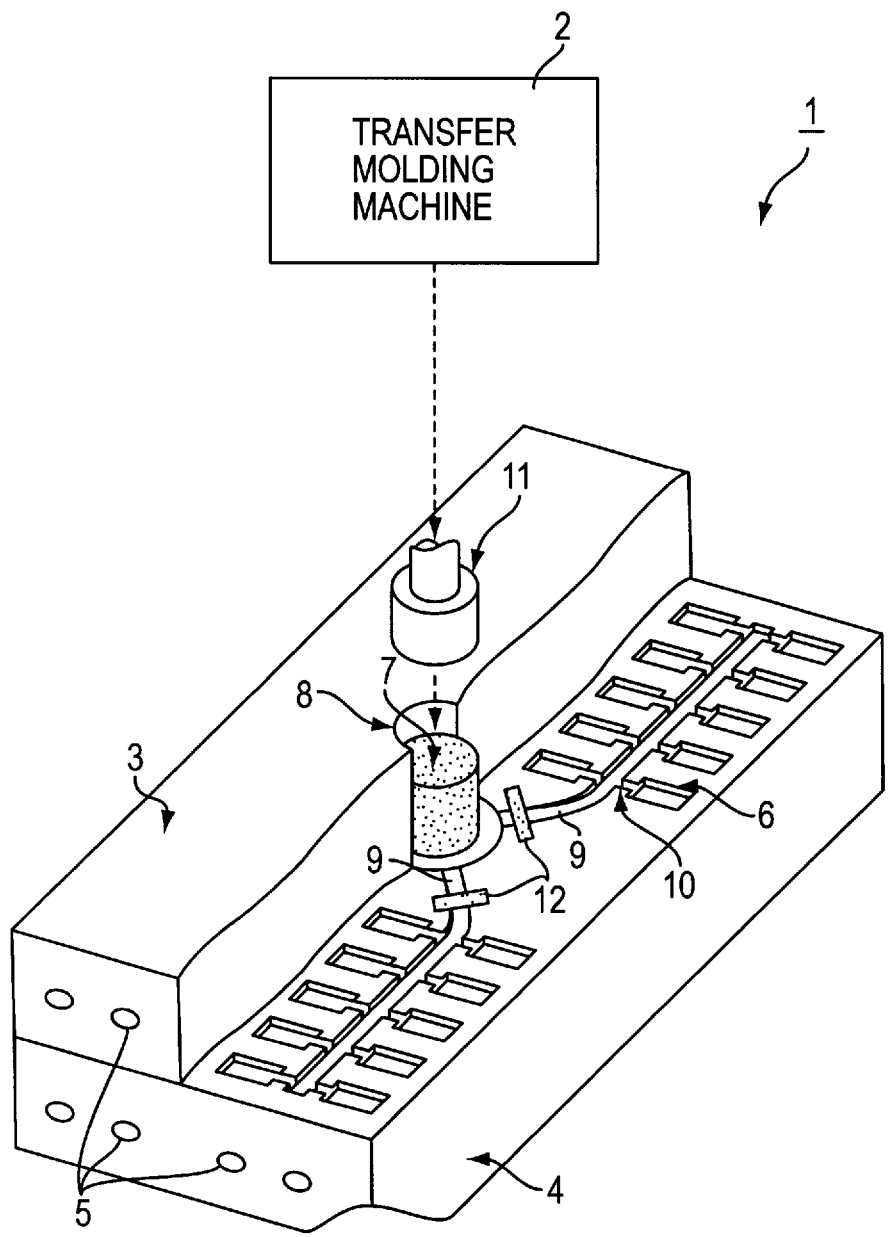
FIG. 1 is a schematic perspective view showing a transfer molding machine and a mold as one embodiment of a production apparatus used for the production of a semiconductor device in the present invention.

The present invention is described in detail below.

A pair of films used in the present invention are required to have a sufficient strength at a molding temperature such that the film does not break during molding. It is preferred to use a film having a tensile strength of from 0.5 to 15.0 kg/mm$^2$ at a molding temperature in the range of from 150° to 250° C. and an elongation of at least 200% in both the extrusion direction and the direction perpendicular to the extrusion direction at the above temperature. In this case, the tensile strength and the elongation are the values measured according to JIS C 2318. During molding, since the film tends to go along the uneven portions of the runner portion, the gate portions, and the cavity portion with flowing of the encapsulating resin, the tensile force acts to the film according to the uneven form of the inside surface of the mold and the injection pressure of the encapsulating resin. If the film does not elongate according to the tensile force, there is a possibility that the film will break without matching the unevenness. However, by using the film having the tensile strength and elongation described above, the film elongates according to the tensile force without breaking and matches the definite state of the cavity surface.

There is no particular restriction on the film if the film has the quality of being capable of enduring the molding temperature and the film can be released from the encapsulating resin after molding. Specifically, a polyester film, a polymethylpentene film, a polyimide film, a polytetrafluoroethylene film, etc., are used with the thickness in the range of from 10 to 100 μm, and preferably from 25 to 75 μm.

In this case, if necessary, a film coated with a heat resistant releasing agent such as a silicone resin, etc., at a thickness of about 0.1 to 5 μm may be used.

In the pot portion of setting the encapsulating resin, to facilitate the setting of the encapsulating resin, it is preferred that the film in contact with the pot portion be adsorbed onto the surface of the inside of the pot and the encapsulating resin be set in the pot portion in this state. In this case, it is preferred that the adsorption means is a plunger for pressing an encapsulating resin equipped to is the pot portion of the molding mold, one end side thereof is positioned at the tip face of the plunger such that the adsorption means leads to the pot portion, and the other end thereof is composed of a suction hole connected to a suction source disposed outside the mold. Also, it is particularly preferred that suction holes having a diameter of from 50 to 200 μm for adsorbing a pair of films be previously formed in not only the pot portion but also in the molding mold surfaces and after adsorbing a pair of films to the upper and lower molds and disposing semiconductor elements with lead frames and the encapsulating resin, the mold is closed to carry out molding.

Since the deformation load of the film in contact with the pot portion around the pot portion is large at molding, is preferred to form a heat resistant reinforcing material layer such as a polyimide film having a tensile strength of 5 to 20 kgf/mm$^2$ at a molding temperature in the range of from 150° to 250° C. on the film on which the encapsulating resin is disposed for the purpose of preventing breakage of the film. The thickness of the heat resistant material layer is preferably from 6 to 100 μm, and the layer is fixed onto the film in contact with the pot portion with a pressure-sensitive adhesive or an adhesive, each having a heat resistance at the position in contact with the plunger.

Also, at molding, if there is a flow resistance between the melt flowing encapsulating resin and a pair of the films, the film is liable to become damaged or is labile to crease, which is undesirable. Accordingly, it is preferred to use a film that the spiral flow value of the encapsulating resin used is at least 80% of the spiral flow value in the case of not inserting the film. That is, it is practically preferred to use a film that the value of the spiral flow (flowability) of the encapsulating resin used at the molding temperature is from 40 to 120 cm, and preferably from 45 to 80 cm, when the value is measured by interposing a pair of the films. If the value is less than 40 cm, the film is liable to damage and also non-filling of the encapsulating resin is liable to occur. If the value is over 120 cm, voids are liable to form in the semiconductor devices after molding. Thus, these cases are undesirable. In addition, the spiral flow value is the value measured according to the EMMI spiral flow test method. As is well known, the spiral flow test is one of the methods of testing the melt flowability of a molding material in a mold, wherein using a mold having a spiral-form cavity, a circinate incense stick-form molding is formed by an injection molding or a transfer molding, and the flowability is evaluated from the length thereof.

For sucking a film into the mold in the above-described production method, it is preferred to use a mold such that a plurality of suction holes each having a diameter of from 50 to 200 μm are formed therein and the suction holes are connected to a suction source disposed outside the mold from the other sides of the holes. If the diameter of the suction holes is shorter than 50 μm, the suction holes are liable to be clogged with resin pieces and surrounding dusts to reduce the force of adsorbing the film. In particular, in the case of reducing the adsorption force of the cavity portion at the semiconductor element side, there is a possibility that wire portions of connecting the circuit of the semiconductor element and lead frames are brought into contact with a film, and the wire deforms or cuts. If the diameter of the suction holes is over 200 μm, when a film is pressed against the suction holes by the pressure at molding, the film is liable to break, whereby the resin, which is the encapsulating material, is liable to flow into the suction holes.

According to another embodiment of the present invention, semiconductor elements with lead frames are disposed on a molding mold having a pot for setting an encapsulating resin in a state such that the semiconductor elements are inserted between a pair of films, the mold is closed, and then an encapsulating resin is injected from the pot where the encapsulating resin is set into spaces between both the films through a hole for injecting an encapsulating resin previously formed in one of the pair of films to fill the inside of the mold cavity, whereby the semiconductor elements are encapsulated with the resin.

For preventing the film used in the present invention from breakage at molding, it is preferred to use a film having a tensile strength thereof of from 0.5 to 15.0 kg/mm$^2$ at the molding temperature in the range of from 150° to 250° C. and an elongation at that temperature of at least 200% in both the extrusion direction and the direction perpendicular to the extrusion direction.

For producing semiconductor devices with a good yield, it is preferred to use a film that the flow resistance between the film used and the melt flowing encapsulating resin is small. The use of the film where the spiral flow value of the encapsulating resin used is at least 80% of the spiral flow value when the film is not inserted is more preferred.

In this case, when the encapsulating resin set in the pot of the mold flows into the cavity portion through the runner portion by heat-pressing the resin, there is a possibility of causing some problems because the film portion of the upper side disposed at the runner portion of the mold goes along the bottom side of the runner portion and the encapsulating resin flows into the space between the film and the mold. For preventing the encapsulating resin from flowing into the space between the mold and the film, it is preferred that a heat-resistant material having a toughness to some extent is inserted linearly across the runner portion or a plurality of heat-resistant materials are inserted linearly across in a ring-form surrounding the pot portion for preventing the film portion disposed at the runner portion from loosening along the bottom side of the runner portion. After closing the mold in this state, molding is carried out. It is also preferred that the heat-resistant material is previously attached to at least one of a pair of the films.

In this case, it is preferred to use a film attached with a heat-resistant material, of which tensile strength is 5 to 20 kgf/mm$^2$ at molding, such as a polyimide resin, an epoxy resin, etc., so that the molten encapsulating resin crosses the runner portion near the pot portion for preventing the molten encapsulating resin from entering the space between the mold and film at molding. In this case, it is preferred to use a mold having a concave portion corresponding to the form of the heat-resistant material as the mold portion corresponding to the heat-resistant material since in this embodiment, the occurrence of scratches of the mold by the heat-resistant material is prevented and movement of the heat-resistant material does not occur.

The encapsulating resin used in the present invention is a generally known resin. Examples thereof include epoxy resins, phenol resins, urea resins, melamine resins, polyester resins, diallyl phthalate resins, polyphenylene sulfide resins, etc. of these resins, epoxy resins are preferably used, and in this case, an epoxy resin is compounded with conventional additives such as a curing agent, a curing accelerator, a filler, a mold-releasing agent, etc., and such a mixture is used as an epoxy resin composition for semiconductor devices.

In the present invention, a transfer material such as a metal foil, a heat-resistant film, etc., is transferred onto the surface of the semiconductor device and such can be used in producing transfer material-covered semiconductor devices. Examples of the transfer material are an aluminum foil, a copper foil, a polyimide film, etc. Usually, a transfer material having a thickness of from 6 to 100 $\mu$m is used. The transfer material is formed on at least one of a pair of films at the position that the film is brought into contact with the cavity portion using a temporary fixing resin layer of a thickness of from 1 to 300 $\mu$m, and preferably from 5 to 70 $\mu$m.

Examples of the present invention are explained below.

First, a production apparatus of semiconductor devices, which can be used in the method of the present invention, is briefly explained.

FIG. 1 shows one embodiment of such a production apparatus. The production apparatus 1 has a pair of upper and lower molds 3 and 6, which can open and close, equipped to a transfer molding machine 2. In these molds 3 and 4, heaters 5, . . . 5 are formed, and also cavities 6 for molding semiconductor devices, a pot 8 for setting an encapsulating resin 7, each runner portion 9 for connecting the pot portion 8 to each cavity 6, and gate portions 10 are formed. After heating the molds 3 and 4 to a predetermined temperature by the heaters 5, the encapsulating resin 7 is set in the pot portion 8 as shown in, for example, FIG. 1, the encapsulating resin 7 in the pot portion is pressed and plasticized in that state by a plunger 11 equipped to the transfer molding machine 2, and the encapsulating resin is injected into each cavity 6 through each runner portion 9 and gate portion 10.

Figure 2:
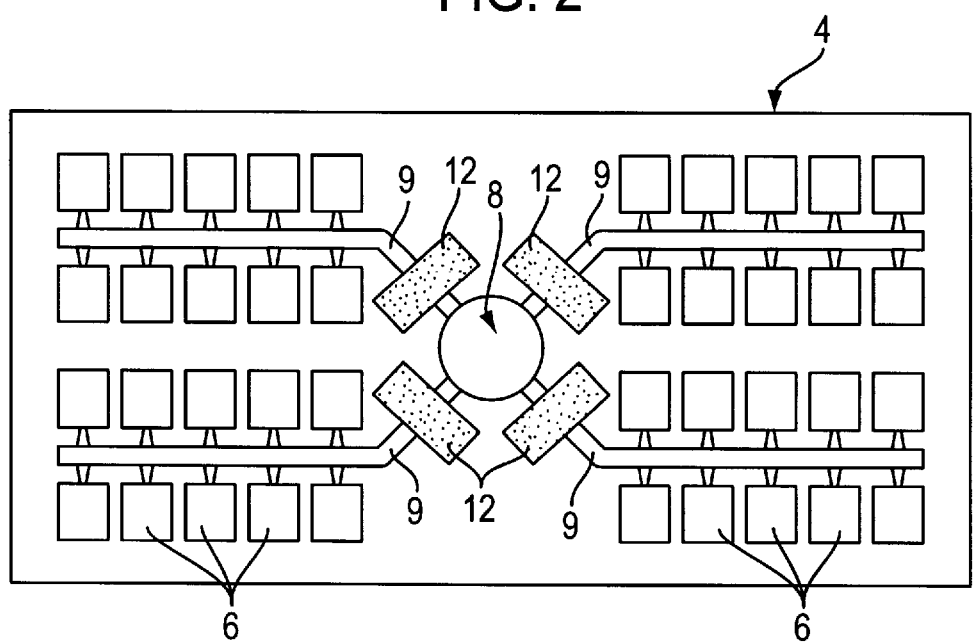
FIG. 2 is a plane view showing the state that a lower mold in the apparatus shown in FIG. 1 seen from above.

In the embodiment shown in FIG. 1, a film having an injection hole for the encapsulating resin is used and each heat-resistant material 12 is further formed near the injection hole for the encapsulating resin at the pot portion 8 or at the boundary portion between the pot portion 8 and each runner portion 9. These heat-resistant materials 12 each is placed on the lower mold 4 and disposed in a definite state of crossing each runner portion 9 position near the pot portion 8 as shown in FIG. 2.

Specific examples of the present invention are then described below.

Figure 3A:
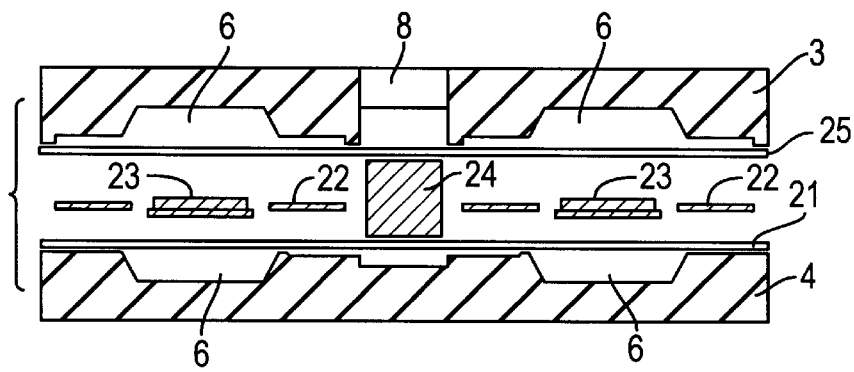
FIG. 3 are views showing each step in one example of the present invention, wherein (A) is a cross sectional view showing the state of inserting semiconductor elements and an encapsulating resin between a pair of films in a state of opening a mold, (B) is a cross sectional view showing the state of closing the mold in the state of setting the films, etc., between both the upper and the lower molds, (C) is a cross sectional view showing the state of pressing the encapsulating resin under heating to fill the inside of a cavity with the molten resin, (D) is a cross sectional view showing the state of releasing the films from the surfaces of the semiconductor devices taken out from the mold after molding, and (E) is cross sectional views showing the semiconductor devices finally obtained.

First, as shown in FIG. 3(A), in an open state of a 28 pin SOJ (Small-Outline-J-leaded package) molding molds 3 and 4, a 60 $\mu$m thick polytetrafluoroethylene (PTFE) film 21 is placed on the lower mold 4. Semiconductor elements 23 with lead frames 22 and an encapsulating resin 24 are set on the film 21 at definite states, and a 60 $\mu$m thick PTFE film is then placed thereon. In this case, the semiconductor elements 23 and the encapsulating resin 24 are set such that they are disposed over the cavity portions 6 and at the pot portion 8, respectively.

Figure 3B:
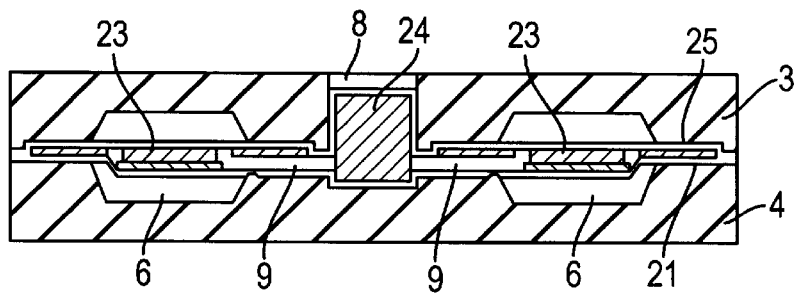
Figure 3C:
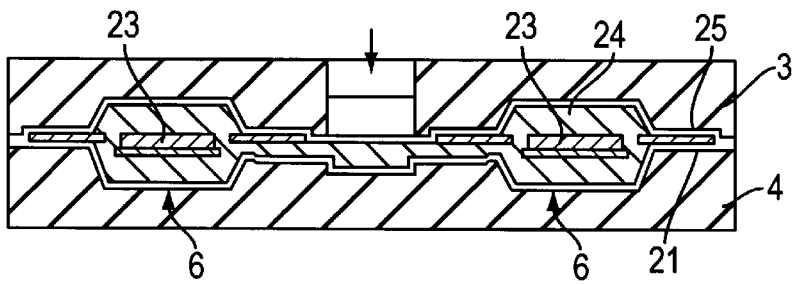

In this state, as shown in FIG. 3(B), the upper and lower molds are closed. In this case, the semiconductors 23 and the encapsulating resin 24 are disposed in the cavity potions 6 and the pot portions 8, respectively, of the molds 3, 4 in the state of being inserted between the upper and lower films 25 and 21. In this state, the encapsulating resin 24 existing in the pot portion 8 is pressed via the film 25 on it. Thus, the encapsulating resin 24 is plasticized, flows into the cavities 6 through each runner portion 9 in the state of being sandwiched between the films 25 and 21, and fills the spaces surrounding the semiconductor elements 23 while pushing the upper and lower films 25 and 21 holding the semiconductor elements 23 between them in the cavities 6 to the inside walls 5 of the cavities.

After encapsulating the semiconductor elements 23 with the encapsulating resin 24 and curing the encapsulating resin 24, the molds 3, 4 were opened and the encapsulated semiconductor elements 23, that is, semiconductor devices 26, are taken out from the molds 3 and 4. In this case, since the semiconductor devices 26 are molded in the state of being sandwiched between the upper and lower films 25 and 21, the semiconductor devices 26 can be easily taken out from the molds 3 and 4 by separating them together with the films 25 and 21 from the mold 4 or 3.

Figure 3D:
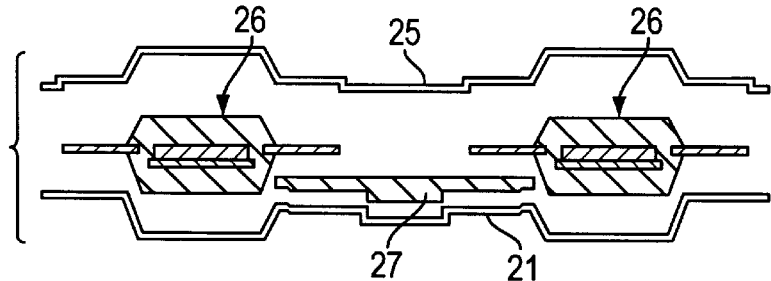

As shown in FIG. 3(D), the films 21 and 25 are released from the surfaces of the semiconductor devices 26 taken out from the molds 3, 4 and unnecessary portion 27 is removed by cutting.

Figure 3E:
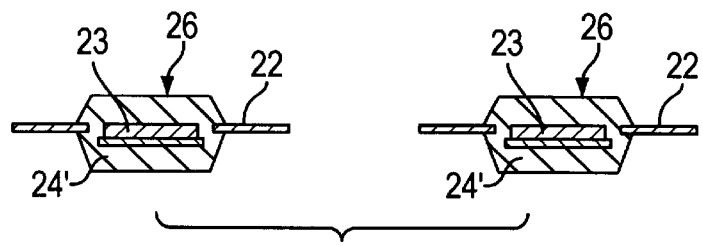

Thus, as shown in FIG. 3(E), the semiconductor devices 26 formed by encapsulating the semiconductor elements with cured encapsulating resin 24' are obtained.

The tensile strength of the PTFE film used was 1.5 kgf/mm$^2$, the elongation thereof was 400%, and the ratio of the spiral flow value at 175° C. of the presence to the absence of the film was 82% and the spiral flow value was 65 cm, but no trouble occurred in molding.

Another example of the present invention is explained by FIG. 4.

Figure 4A:
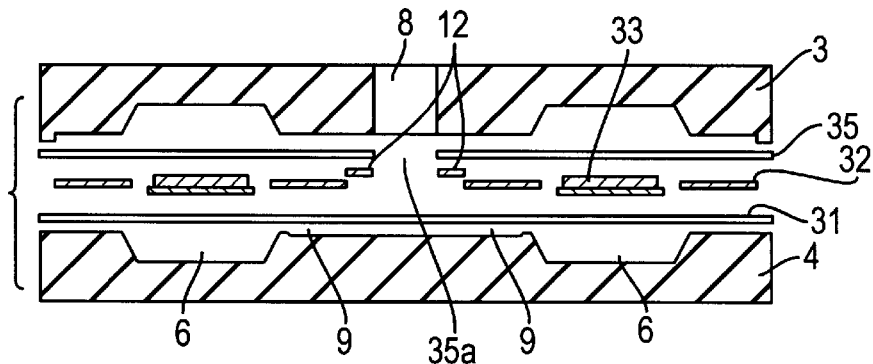
FIG. 4 are views showing each step in another example of the present invention, wherein (A) is a cross sectional view showing the state of inserting semiconductor elements and heat resistant materials between a pair of films in a state of opening a mold, (B) is a cross sectional view showing the state of setting an encapsulating resin in a pot portion of the mold after setting the films, etc., between the molds and closing the mold, (C) is a cross sectional view showing the state of pressing the encapsulating resin, injecting the encapsulating resin in the inside of a cavity from a hole for injecting the encapsulating resin formed in the film at the upper side and filling the cavity with the encapsulating resin, (D) is a cross sectional view showing the state of releasing the films from the surfaces of the semiconductor devices taken out from the mold after molding, and (E) is a cross sectional view showing the semiconductor devices finally obtained.

As shown in FIG. 4(A), in the state of opening a pair of upper and lower molds 3 and 4, a 60 $\mu$m thick PTFE film 31 is placed on the lower mold 4, and semiconductor elements 33 with lead frames 32 are then set on the film 31 at the cavity portions 6. In this example, a heat-resistant materials 12 composed of a 50 μm thick polyimide film each is set at each runner portion 9 positioned near the pot portion 8 of the mold. In this case, each heat-resistant material 12 is set in the state of crossing each runner portion 9 near the pot portion in the lower mold 4 as the heat-resistant material shown in, for example, FIG. 1 and FIG. 2 described above. Thus, after successively setting the film 31, the semiconductor elements 33, and the heat-resistant materials 12 on the lower mold 4, a 60 μm thick PTFE film 35 having a hole 35a previously formed at the portion only for injecting an encapsulating resin corresponding to the pot portion 8 is placed thereon.

Figure 4B:
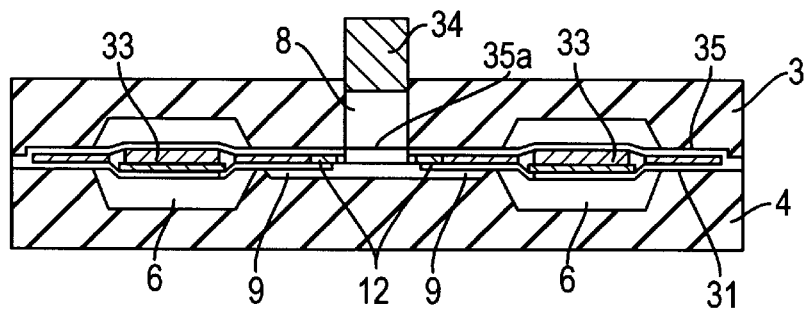
Figure 4C:
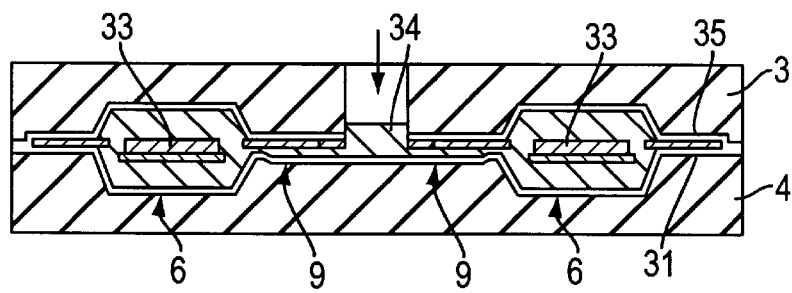
Figure 4D:
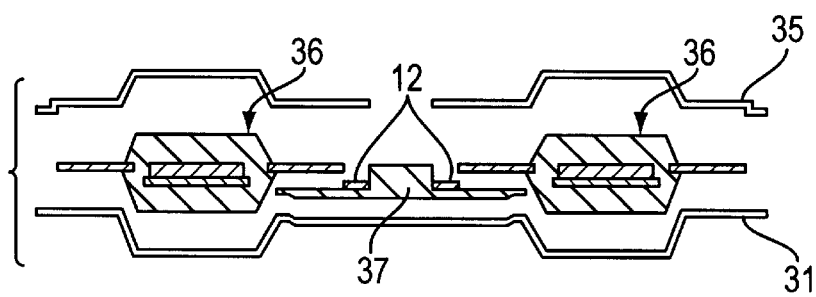
Figure 4E:
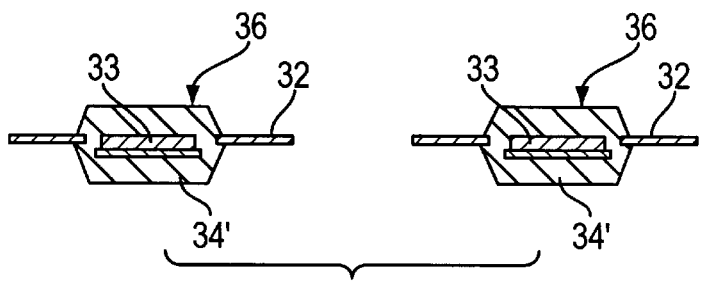

In this state, as shown in FIG. 4(B), the upper and lower molds 3, 4 are closed. An encapsulating resin 34 is set in the mold pot 8 under which the hole 35 is positioned, and by pressing the encapsulating resin 34 by a plunger (see FIG. 1) in that state, the encapsulating resin fills the insides of the cavities through the space between the upper and lower films 35 and 31 in each runner portion 9. In this case, since the heat-resistant materials 12 are formed as crossing each runner portion 9 between the upper and lower films 35 and 31, sagging of the upper film 35 into the runner portions 9 is prevented, whereby the encapsulating resin 34 injected through the hole 35a for injecting the encapsulating resin passed through the space between the upper and lower films 35 and 31 in each runner portion 9. Thus, the entrance of the encapsulating resin in each space between each of the films 35 and 31 and each of the molds 3 and 4 can be surely prevented.

After filling the insides of the cavities 6 with the encapsulating resin 34, the semiconductor devices are taken out together with a pair of the films as in the case of FIG. 3 and after carrying out the definite works, semiconductor devices 36 formed by the semiconductor elements encapsulated with the cured encapsulating resin 34' can be obtained. In this case, mold-releasing of the semiconductor devices 36 from the molds 4 and 3 after molding is very easy since mold-releasing thereof is performed together with the films 31 and 35. Also, when the molding work as described above was repeatedly carried out 1,000 times, the molds 3 and 4 were not stained and it was confirmed that the excellent releasability was maintained.

For the sake of comparison, a comparative example of molding without using a pair of films is explained.

After setting semiconductor elements with lead frames on the lower mold of a 28 pin SOJ molding mold, the upper mold was closed, and in this state an encapsulating resin was injected in the inside of cavities by an ordinary method to encapsulate the semiconductor elements with the encapsulating resin. Thus, semiconductor devices were obtained. When molding was tried 1,000 times, the releasability was poor a little at the beginning (molding number: 1 to 12 times), and thereafter, the moldability became good. However, when the molding number was over 400 times, the moldability became inferior and after 620 times, cleaning of the mold became necessary.

Still another example of the present invention is explained.

Figure 5A:
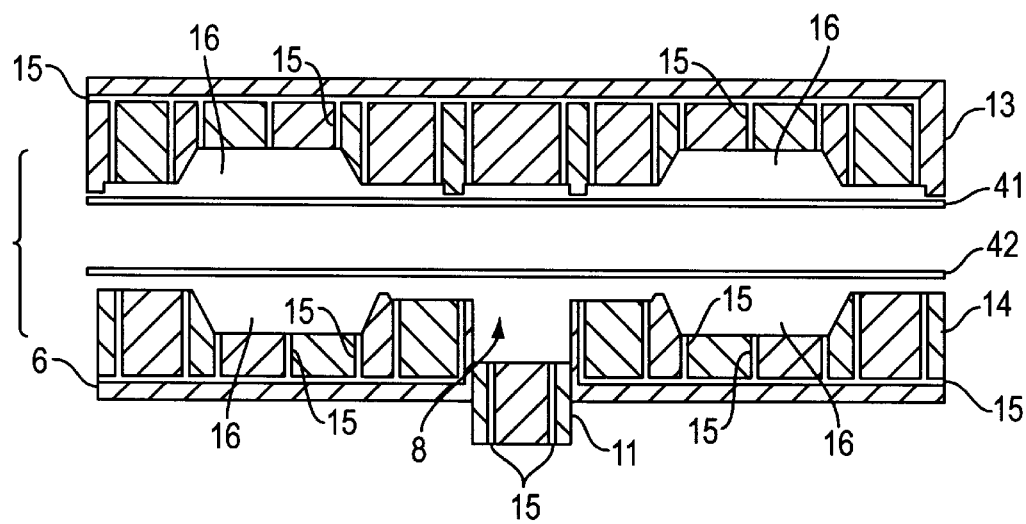
FIG. 5 are views showing each step of still another example of the present invention, wherein (A) is a cross sectional view showing the state of setting a pair of films to the corresponding surfaces of upper and lower molds in a state of opening the mold, (B) is a cross sectional view showing the state of setting semiconductor elements and an encapsulating resin between the film after adsorbing each film on each corresponding surface of the mold, (C) is a cross sectional view showing the state of closing the mold after setting them, (D) is a cross sectional view showing the state of pressing the encapsulating resin and filling the inside of a cavity with the resin, (E) is a cross sectional view showing the state of releasing the films from the surfaces of the semiconductor devices taken out from the mold after molding, and (F) is a cross sectional view showing the semiconductor devices finally obtained.

FIG. 5(A) shows a pair of upper and lower molds 13 and 14 (in this example, 80 pin QFP mold) equipped to a transfer molding machine. In the molds 13 and 14, a plurality of cavities 16 and a circular concave pot portion 8, in which an encapsulating resin described below is set, connected to the cavities are formed, and in the pot portion 8, a plunger 11 for pressing the encapsulating resin is equipped vertically movably. In this example, heaters for heating each mold to a definite temperature at molding are equipped to both the molds 13 and 14.

In both the molds 13 and 14 and the plunger 11 are formed a plurality suction holes 15, one end of each of which is opened at the corresponding position of a space portion wherein an encapsulating resin 54 (see, FIG. 5(B)) will be brought into contact with films 41 and 42 as will be described below, that is, the space portion formed from the pot portion 8 in which the encapsulating resin 54 will exist at filling the encapsulating resin to the cavities 16 and the other end of which is connected to an external suction source (not shown) such as a suction pump. By sucking the cavity sides 16 through each suction hole 15 from the external suction source, the corresponding films 41 and 42 can be adsorbed to the surfaces thereof.

The method of producing semiconductor devices using such a molding apparatus is explained.

First, as shown in FIG. 5(A), in the state of opening the upper and lower molds 13 and 14, a pair of films, i.e., PTFE films 41 and 42 each having a thickness of 40 μm corresponding to the molds 13 and 14 are set at definite states in the space between the molds 13 and 14.

Figure 5B:
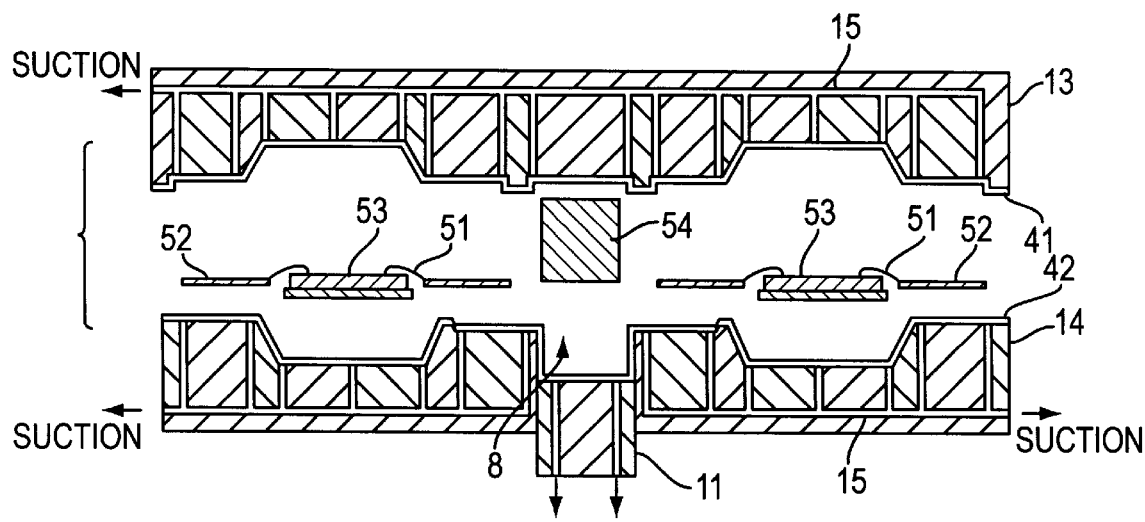

As shown in FIG. 5(B), the space side formed between each film 41 or 42 and each mold 13 or 14 is sucked by an external suction source through the suction holes 15 formed in each mold 13 or 14 and the plunger 11. Thus, each of the films 41 and 42 each corresponding to the inside surface of each mold and the end surface of the plunger, at which the open end of the suction holes 15 are positioned, is adsorbed to the surfaces to provide the state that each film is disposed along the inside surface of each mold and the end surface of the plunger. In the state, semiconductor elements 53 each having lead frames 52 each connected and fixed by a wire bond portion 51 composed of a gold wire and an encapsulating resin 54 are set on the film 2 on the lower mold 14. In this case, the semiconductor elements 53 are set at the positions corresponding to the cavities 16, respectively, and the encapsulating resin 54 is set at the pot portion 8 above the plunger 11.

Figure 5C:
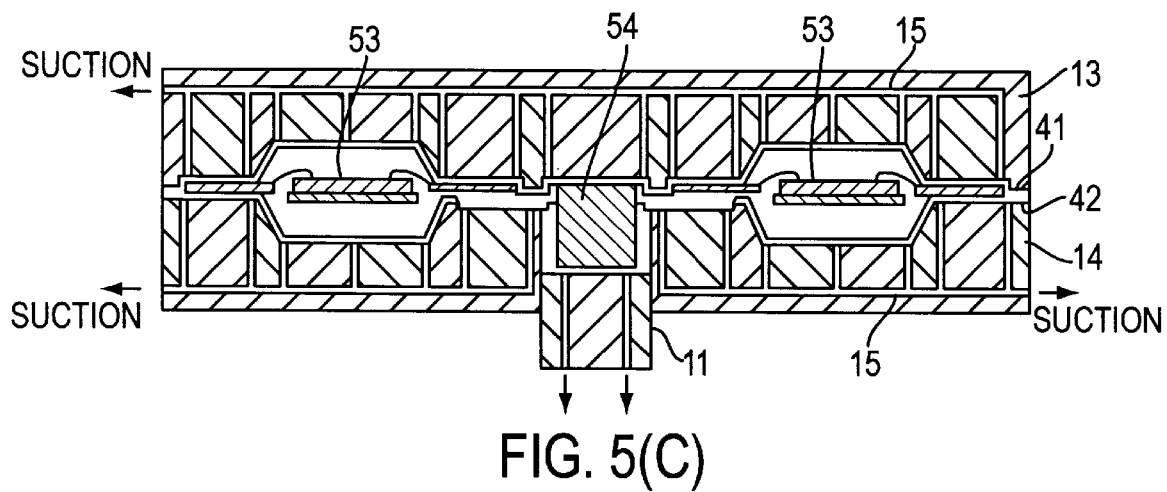
Figure 5D:
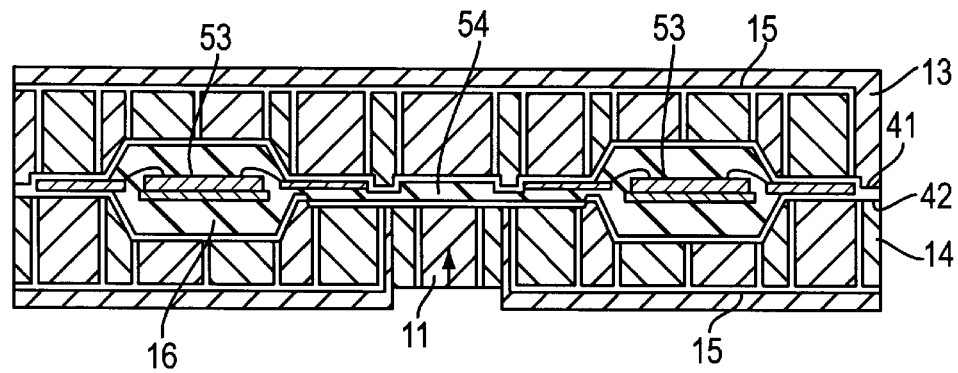

As shown in FIG. 5(C), the upper and lower molds are closed. When the molds 13 and 14 are closed, the encapsulating resin 54 is positioned in the pot portion 8 in the state of being sandwiched between both the films 41 and 42, but each semiconductor element 53 is positioned in the state of having a space with each of the upper and lower films 41 and 42. In this state, the encapsulating resin 54 in the pot portion is pressed by pushing up the plunger 11 in the direction of the arrow as shown in FIG. 5(D), whereby the encapsulating resin 54 is plasticized, flows through the runners and gates between both the films 41 and 42, and fills the inside of each cavity 16.

Figure 5E:
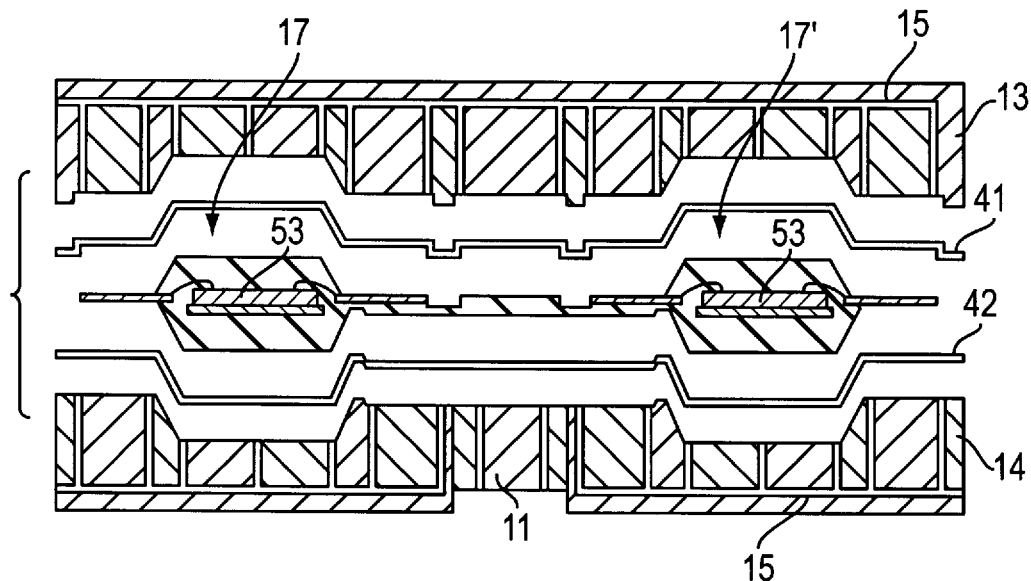
Figure 5F:
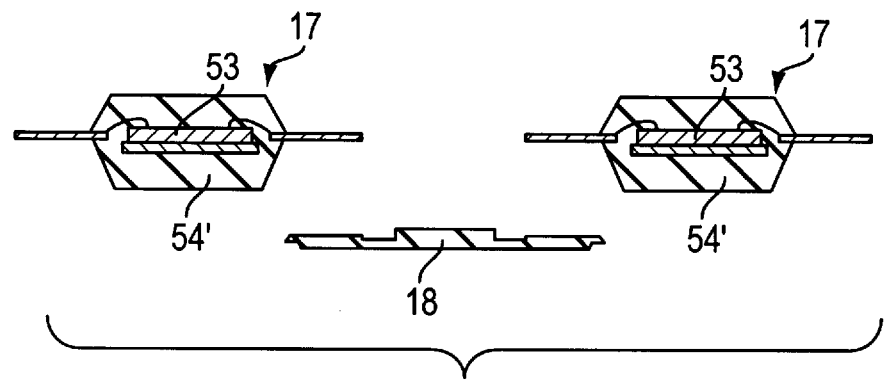

After filling the insides of the cavities 16 with the encapsulating resin 54 and curing the encapsulating resin, the molds 13 and 14 are opened as shown in FIG. 5(E). The semiconductor elements encapsulated with the encapsulating resin, that is, semiconductor devices 17, are taken out from the mold together with the films 41 and 42, both the films 41 and 42 are released from the surfaces of the packages, and as shown in FIG. 5(F), an unnecessary molded portion 18 is cut off. Thus, as shown in FIG. 5(F), the semiconductor devices 17 encapsulated with the cured encapsulating resin 54' are obtained.

In the case described above, when the diameter of the suction holes was 60 μm, 120 μm, or 180 μm, molding could be carried out without causing any trouble. However, when the diameter of the suction holes was 30 μm, the adsorption of the film was insufficient. Further, when the diameter was 240 μm, the damage of the film was seen and the encapsulating resin flowed in the suction holes, whereby the apparatus could not continuously be used in this state.

Figure 6A:
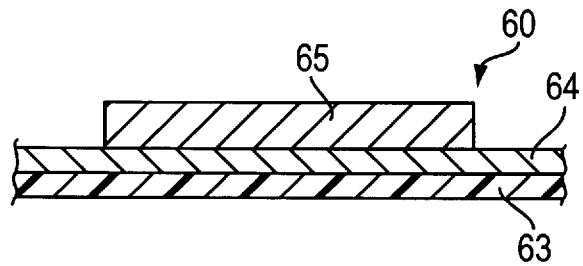
FIG. 6 is views showing an embodiment of the structure of a molding film formed by laminating a film and a metal foil material, wherein (A) is a cross sectional view showing laminated layers obtained by laminating a metal foil material on a film through a temporarily fixing resin layer, (B) and (C) are cross sectional views each showing laminated layers obtained by forming a temporarily fixing resin layer on a film and laminating a metal foil material having a recording resin layer on the temporarily fixing resin layer through the recording resin layer.
Figure 6B:
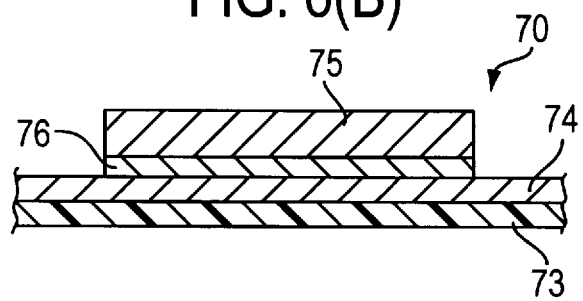
Figure 6C:
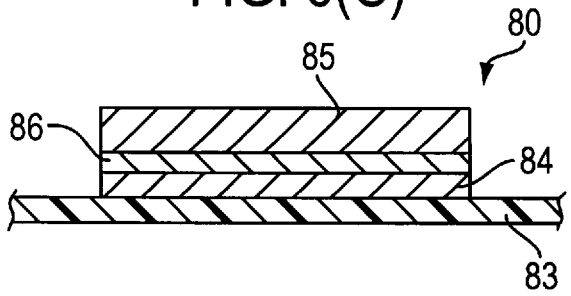

FIG. 6 shows a cross sectional view of each film for molding used for obtaining metal foil-covered semiconductor devices by molding using a metal foil material at the portion in contact with the mold cavity potions of the film. In this case, as shown in FIG. 6(A) to (C), various kinds of molding films each formed by laminating a metal foil material on the film via a temporarily fixing resin layer can be used.

A molding film 60 shown in FIG. 6(A) is a film obtained by forming a metal foil material (e.g., aluminum foil) 65 on a film 63 via a temporarily fixing resin layer 64 having a releasing property to an encapsulating resin, wherein the 180° peeling adhesive force of the temporarily fixing resin layer 64 to the metal foil material 65 is from 0.05 to 0.50 kgf/cm, and molding films 70 and 80 shown in FIG. 6(B) and (C) are films each obtained by forming a temporarily fixing resin layer 74 or 85 having a releasing property to an encapsulating resin on a molding film 70 or 80 and laminating a metal foil material 75 or 85 having a recording material layer 76 or 86, respectively, on the resin layer 74 or 84 via the recording material layer 76 or 86, wherein the 180° peeling adhesive force of the temporarily fixing resin layer 74 or 84 to the recording material layer 76 or 86 is from 0.05 to 0.50 kg/cm.

In the case of using these films, metal foil-covered semiconductor devices can be obtained by molding as in the examples described above except for setting the film such that the film surface at the side of not forming the metal foil material is at the surfaces of mold cavities.

Although an interfacial adhesive force between the temporarily fixing resin layer and the film is not described—FIG. 6, when the 180° peeling adhesive force of this portion is from 0.05 to 0.50 kgf/cm, the temporarily fixing resin layer can be transferred to the metal foil side. In this case, the temporarily fixing resin layer can be used as a recording layer.

As described above in detail, according to the present invention, since an encapsulating resin melts and flows in a pair of films, the abrasion of a mold at flowing the encapsulating resin and, in particular, staining of the mold with residues of the encapsulating resin at the cavity portions do not occur, whereby cleaning of the mold becomes unnecessary. Also, after molding, semiconductor devices kept between films after molding can be taken out from the mold together with the films, and therefore, eject pins may not equip to the mold, etc. Thus, according to the present invention, the molding time can be shortened, the continuous molding property can be improved, and the cost of the mold can be reduced.

While the invention has been described in detail and with reference to specific embodiments thereof, it will be apparent to one skilled in the art that various changes and modifications can be made therein without departing from the spirit and scope thereof.

What is claimed is:

1. A method of producing a semiconductor device by encapsulating a semiconductor element with a resin comprising the steps of:

providing a molding mold having a pot for receiving the encapsulating resin, at least one mold cavity, and at least one runner portion connecting said at least one mold cavity to said pot, placing a semiconductor element with lead frames and an encapsulating resin between a pair of films affixed to said molding mold, closing said molding mold, heating said encapsulating resin, pressing said encapsulating resin between said films with a plunger, and injecting the molten encapsulating resin in the inside of the mold cavity from said pot through the runner portion to encapsulate the semiconductor element with said encapsulating resin;

wherein said films are in contact with said pot in said molding mold and are adsorbed onto the inside surface of said pot;

wherein suction holes are formed in said plunger as the adsorption means of said films in contact with said pot portion, wherein said suction holes are open at the tip of said plunger such that said pot portion is in communication with an external suction source though said suction holes;

wherein suction holes having a diameter of from 50 to 200 μm are formed in said molds and said plunger;

wherein said suction holes open to a space where the encapsulating resin is brought into contact with said films such that said space is in communication with an external suction source; and wherein after sucking said films to said mold, said semiconductor element with lead frames and said encapsulating resin are placed between said films, said mold is closed, and molding is carried out.

2. The method of producing a semiconductor device as claimed in claim 1, wherein said films have a tensile strength of from 0.5 to 15 kg/mm$^2$ at a molding temperature in the range of from 150° to 250° C. and an elongation at said molding temperature of at least 200% in both an extrusion direction and a direction perpendicular to said extrusion direction.

3. The method of producing a semiconductor device as claimed in claim 1, wherein said encapsulating resin is set on the film in contact with said pot, and a heat-resistant reinforcing material layer having a tensile strength of 5 to 20 kgf/mm$^2$ at a molding temperature of from 150° to 250° C. is formed on the film at a position in contact with the plunger.

4. The method of producing a semiconductor device as claimed in claim 1, wherein the spiral flow of said encapsulating resin used at the molding temperature is from 40–120 cm.

5. A method of producing a semiconductor device by encapsulating a semiconductor element with a resin comprising the steps of:

placing a semiconductor element with lead frames between a pair of films affixed to a molding mold having a pot for receiving an encapsulating resin, closing said mold, injecting an encapsulating resin placed in the pot into a space between said films through a hole previously formed in one of said films by pressing said encapsulating resin with a plunger, and filling the inside of the mold cavity with said encapsulating resin to encapsulate the semiconductor element;

wherein a heat-resistant material is linearly inserted in a ring form crossing runner portions near the pot to prevent the encapsulating resin from flowing into the space between the mold and the film before the mold is closed.

6. The method of producing a semiconductor device as claimed in claim 5, wherein said heat-resistant material is previously attached to at least one said films.

7. The method of producing a semiconductor device as claimed in claim 5, wherein said films have a tensile strength of from 0.5 to 15.0 kg/mm$^2$ at a molding temperature of from 150° to 250° C. and an elongation of at least 200% in both an extrusion direction and a direction perpendicular to said extrusion direction.

8. The method of producing a semiconductor device as claimed in claim 7, wherein the spiral flow of said encapsulating resin used at said molding temperature is from 40 to 120 cm.

9. The method of producing a semiconductor device as claimed in claim 1, wherein a transfer material being transferred to the surface of said semiconductor device is temporarily fixed to at least one of said films.

10. The method of producing a semiconductor device as claimed in claim 5, wherein a transfer material being transferred to the surface of said semiconductor device is temporarily fixed to at least one of said films.

* * * * *